(12) United States Patent
Lee et al.

(10) Patent No.: US 7,800,966 B2
(45) Date of Patent: Sep. 21, 2010

(54) PRECHARGE CONTROL CIRCUIT

(75) Inventors: Kyong Ha Lee, Yongin-si (KR); Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 318 days.

(21) Appl. No.: 12/001,667

(22) Filed: Dec. 12, 2007

(65) Prior Publication Data

US 2009/0003106 A1 Jan. 1, 2009

(30) Foreign Application Priority Data

Jun. 29, 2007 (KR) .................... 10-2007-0065851

(51) Int. Cl.
*G11C 7/00* (2006.01)

(52) U.S. Cl. ............. 365/203; 365/189.11; 365/189.08; 365/189.05; 365/63

(58) Field of Classification Search ................. 365/203, 365/189.11, 189.08, 189.05, 63
See application file for complete search history.

(56) References Cited

U.S. PATENT DOCUMENTS

| | | | | |
|---|---|---|---|---|
| 6,061,285 | A * | 5/2000 | Tsukikawa | 365/201 |
| 6,233,188 | B1 | 5/2001 | Kai | |
| 6,310,808 | B1 * | 10/2001 | Tanizaki | 365/203 |
| 6,643,218 | B1 | 11/2003 | Chun | |
| 6,657,908 | B2 * | 12/2003 | Yoon et al. | 365/203 |

FOREIGN PATENT DOCUMENTS

| | | |
|---|---|---|
| KR | 10-0560935 B1 | 3/2006 |
| KR | 10-2007-0036598 A | 4/2008 |

\* cited by examiner

*Primary Examiner*—Tuan T. Nguyen
(74) *Attorney, Agent, or Firm*—John P. White; Cooper & Dunham LLP

(57) ABSTRACT

A precharge control circuit includes a precharge control unit and a precharge unit. The precharge control unit controls and outputs a precharge signal in response to a read command signal, a write command signal, and a first signal. The precharge unit precharges local input/output lines in response to a signal output from the precharge control unit.

18 Claims, 5 Drawing Sheets

PRECHARGE CONTROL CIRCUIT

BACKGROUND

The present disclosure relates to a semiconductor memory device, and more particularly, to a precharge control circuit.

FIG. 1 illustrates a circuit diagram of a conventional precharge circuit for precharging local input/output lines LIO. FIG. 2 illustrates a circuit diagram of a conventional precharge control circuit. FIG. 3 illustrates a timing diagram of the conventional precharge control circuit of FIG. 2.

Referring to FIG. 1, in a conventional precharge circuit 100, a signal LIORST is set to a logic high level during a burst operation to perform a write or read operation. After a write or read operation for a first address, the signal LIORST is set to a logic low level to precharge the local input/output lines LIO. Thereafter, the signal LIORST is again set to the logic high level during a next burst operation to perform a write or read operation, and the precharging of the local input/output lines LIO is repeated until the burst operation is ended.

However, in a case where the write operation is repeated, a precharging operation is not required because data is input from an external source to strongly drive a write driver. Meanwhile, in a case where the read operation is repeated, the precharging operation is necessary because the local input/output lines LIO are sensed with a small voltage difference.

Referring to FIG. 2, in order to avoid an unnecessary precharging operation, a conventional precharge control circuit uses a signal WTRDB to precharge the local input/output lines LIO during only a read operation, not precharging local input/output lines LIO during a write operation. The signal WTRDB is set to a logic high level during a write operation and to a logic low level during a read operation. The signal WTRDB is NANDed with a signal TM_WTNOPCG. The resultant NANDed signal can be controlled by a test mode signal.

A control signal WTNOPCG output in this manner is NORed with a signal LIO_RST to generate a signal LIO_RST_RD for precharging the local input/output lines LIO.

Referring to FIG. 3, the signal LIO_RST_RD is maintained at a logic high level during a write operation. Thus, the conventional precharge control circuit performs a precharge operation only during a read operation, without performing a precharge operation during the write operation.

In this instance, the circuit can be easily changed using the existing signal WTRDB. However, as illustrated in FIG. 3, a sufficient timing margin may not be provided at a point T2 at which the write operation is switched to the read operation, and a high voltage and a high-frequency clock may cause an error in the precharging operation.

BRIEF SUMMARY

In an aspect of the present disclosure, a precharge control circuit includes a precharge control unit controlling and outputting a precharge signal in response to a read command signal, a write command signal, and a first signal, and a precharge unit precharging local input/output lines in response to a signal output from the precharge control unit.

The first signal may be activated during a last burst operation.

The precharge control unit may include a control signal generating unit generating a control signal in response to the read command signal, the write command signal, and the first signal, and an operation unit performing a logic operation on the control signal and the precharge signal.

In another aspect of the disclosure, a precharge control circuit includes a control signal generating unit generating a control signal in response to a read command signal, a write command signal, and a first signal, an operation unit performing a logic operation on the control signal and a precharge signal, and a precharge unit precharging local input/output lines in response to an output signal of the operation unit.

BRIEF DESCRIPTION OF THE DRAWINGS

The above and other features of the subject matter of this disclosure will be more apparent from the following detailed description taken in conjunction with the accompanying drawings, in which.

DESCRIPTION OF EXEMPLARY EMBODIMENTS

Hereinafter, precharge control circuits in accordance with exemplary embodiments of the present invention will be described in detail with reference to the accompanying drawings.

Figure 1:
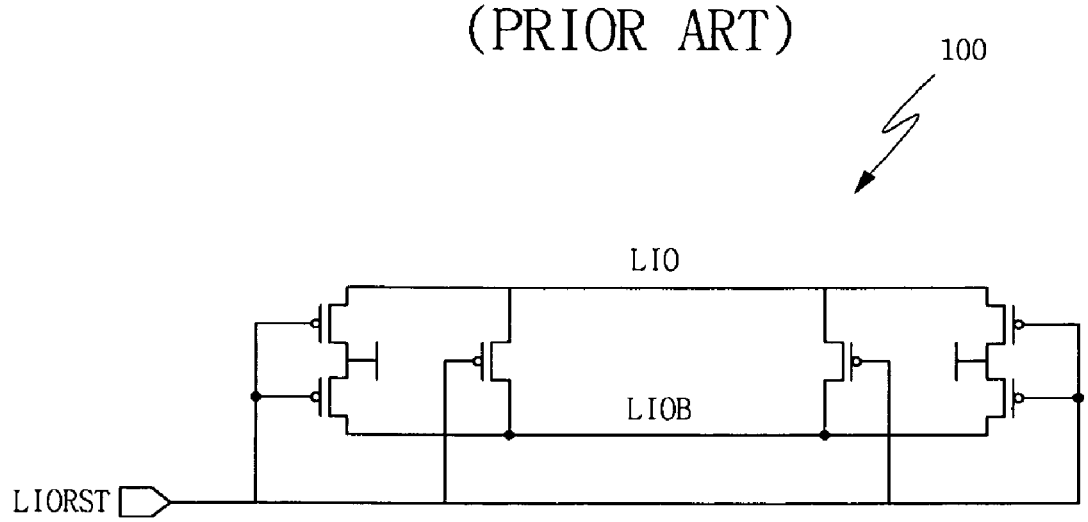
FIG. 1 illustrates a circuit diagram of a conventional precharge circuit for precharging local input/output lines (LIO)
Figure 2:
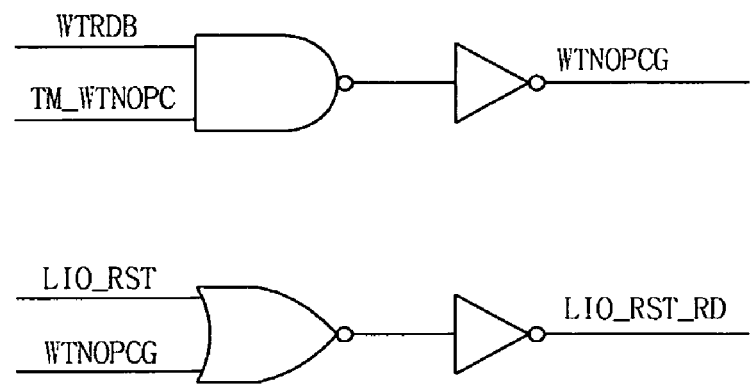
FIG. 2 illustrates a circuit diagram of a conventional precharge control circuit.
Figure 3:
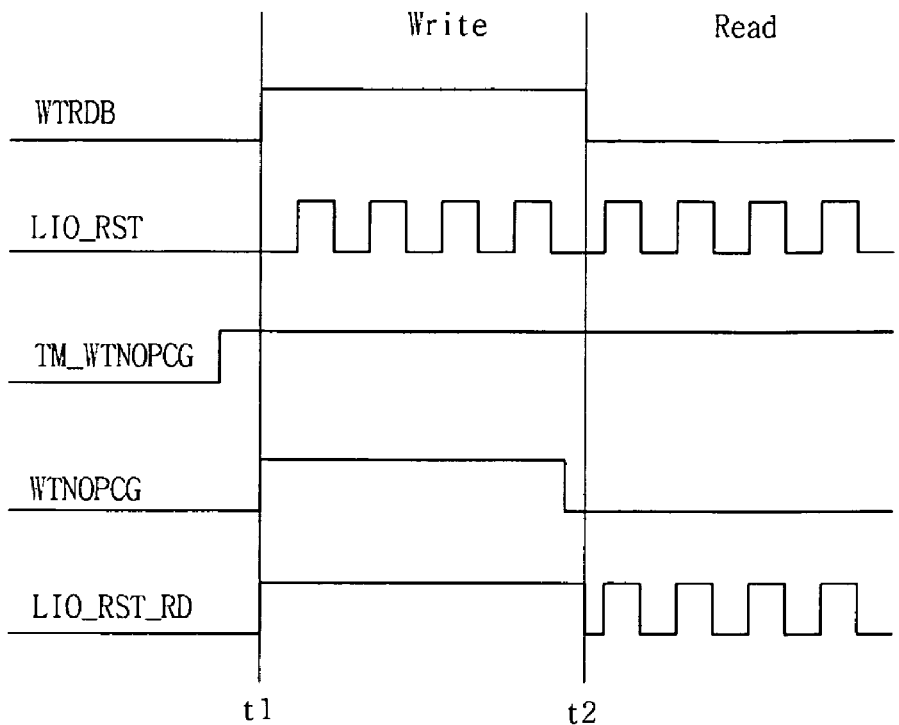
FIG. 3 illustrates a timing diagram of the conventional precharge control circuit of FIG. 2.
Figure 4:
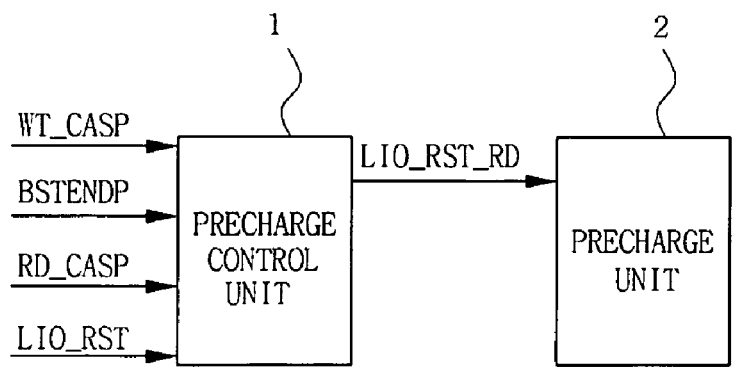
FIG. 4 illustrates a precharge control circuit according to an exemplary embodiment of the present invention.

FIG. 4 illustrates a precharge control circuit according to an exemplary embodiment of the present invention.

Referring to FIG. 4, a precharge control circuit includes a precharge control unit 1 which controls and outputs a precharge signal LIO_RST in response to a write command signal WT_CASP, a read command signal RD_CASP, and a signal BSTENDP activated during a last burst operation, and a precharge unit 2 which precharges local input/output lines LIO in response to a signal LIO_RST_RD output from the precharge control unit 1.

Figure 5:
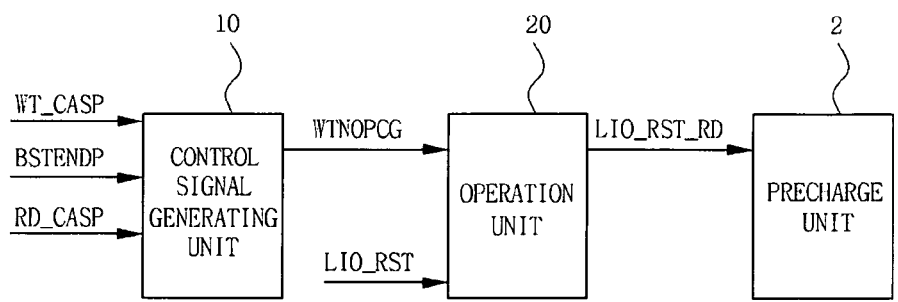
FIG. 5 illustrates a precharge control circuit according to another exemplary embodiment of the present invention.

FIG. 5 illustrates a precharge control circuit according to another exemplary embodiment of the present invention.

Referring to FIG. 5, a precharge control circuit includes a control signal generating unit 10 which generates a control signal WTNOPCG in response to a write command signal WT_CASP, a read command signal RD_CASP, and a signal BSTENDP activated during a last burst operation, an operation unit 20 which performs a logic operation on the control signal WTNOPCG and a precharge signal LIO_RST, and a precharge unit 2 which precharges local input/output lines LIO in response to a signal LIO_RST_RD output from the operation unit 20.

Figure 6:
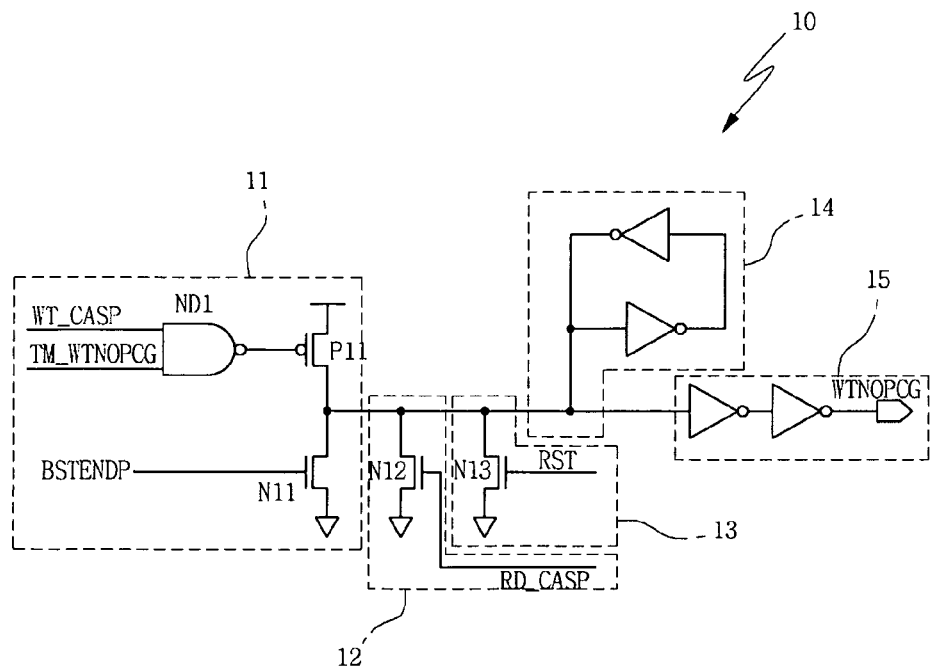
FIG. 6 illustrates a circuit diagram of a control signal generator of FIG. 5.

FIG. 6 illustrates a circuit diagram of a control signal generator of FIG. 5. Referring to FIG. 6, the control signal generating unit 10 includes a first driving unit 11 driven in response to the write command signal WT_CASP and the signal BSTENDP activated during the last burst operation, and a second driving unit 12 driven in response to the read command signal RD_CASP.

The first driving unit 11 includes a logic device ND1 which performs a NAND operation on the write command signal WT_CASP and a test mode signal TM_WTNOPCG, a pull-up driving unit P11 pull-up driven in response to an output signal of the logic unit ND1, and a pull-down driving unit N11 pull-down driven in response to the signal BSTENDP.

The second driving unit 12 includes a pull-down driving unit N12 pull-down driven in response to the read command signal RD_CASP.

The control signal generating unit 10 further includes a reset unit 13 pull-down driven in response to a reset signal RST.

The control signal generating unit 10 further includes a latch unit 14 which latches output signals of the first driving unit 11 and the second driving unit 12.

The control signal generating unit 10 further includes a buffer unit 15 which buffers output signals of the first driving unit 11 and the second driving unit 12.

Figure 7:
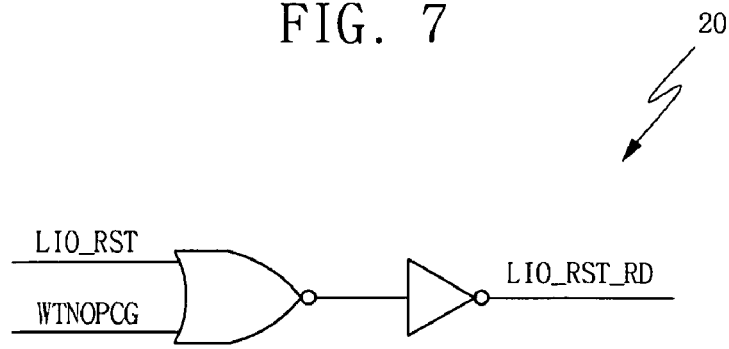
FIG. 7 illustrates a circuit diagram of an operation unit of FIG. 5.

FIG. 7 illustrates a circuit diagram of an operation unit of FIG. 5. Referring to FIG. 7, an operation unit 20 includes a logic device which performs an OR operation on the control signal WTNOPCG and the precharge signal LIO_RST.

Hereinafter, operation of the above embodiment will be described with reference to drawings.

Referring to FIG. 6, in the control signal generating unit 10, a control signal WTNOPCG is set to a logic high level when a signal WT_CAST generated in response to a write command is input. Referring to FIG. 7, the operation unit 20 performs an OR operation on the control signal WTNOPCG and a precharge signal LIO_RST to output a signal LIO_RST_RD.

The signal WT_CAST is NANDed with a signal TM_WTNOPCG. The resultant NANDed signal can be controlled by a test mode signal. A point at which control signal WTNOPCG falls to a logic low level is a point at which the last burst pulse is generated, i.e., a signal BSTENDP rises to a logic high level.

Hence, local input/output lines LIO are not precharged during a burst write. In a case where the read command signal is input, the operation unit 20 is normally operated because the control signal WTNOPCG is previously set to the logic low level. On the other hand, in a case where the write command signal is input, the operation unit 20 repeats previous operation. The control signal WTNOPCG is further reset in two cases. One is a case where a reset RST signal is input. The other is a case where a signal RD_CASP is input.

In a case where the reset RST signal is input, a latch unit 14 for generating the control signal WTNOPCG is initialized when a chip is reset. In a case where the signal RD_CASP is input, a write interrupt operation is performed by a read command. The latch unit 14 is installed for obtaining a maximum timing margin.

Figure 8:
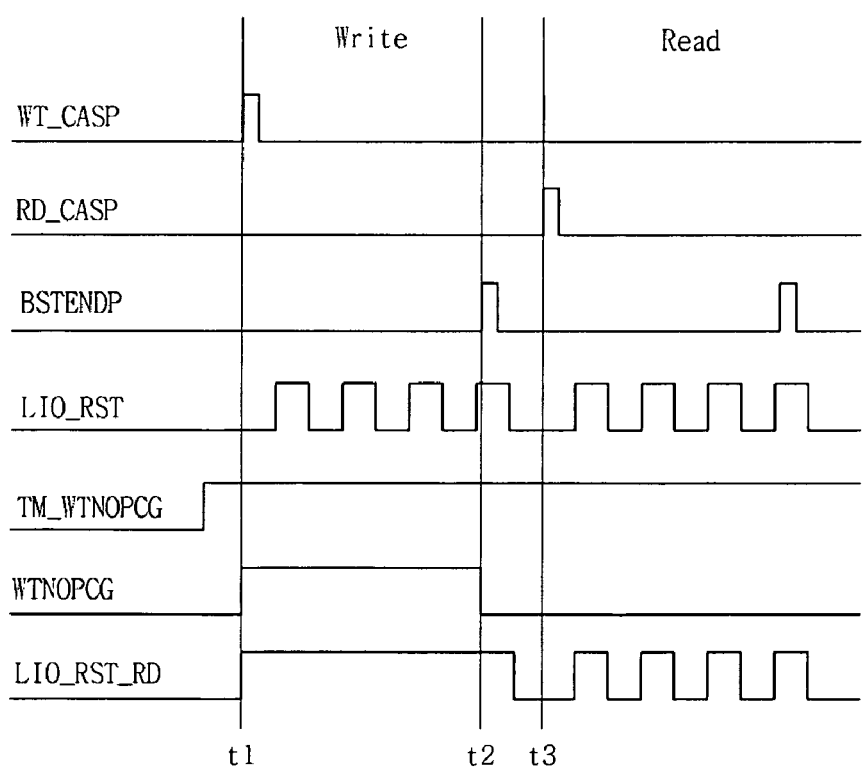
FIG. 8 illustrates a timing diagram of the precharge control circuit according to the exemplary embodiments of FIGS. 4 and 5.

FIG. 8 illustrates a timing diagram of the precharge control circuit according to examples of operation of the present invention.

Referring to FIG. 8, a signal WT_CASP is generated when a write command is input at a point t1 and then a control signal WTNOPCG is set to a logic high level. A test mode signal TM_WTNOPCG is previously set to the logic high level.

Thereafter, the control signal is maintained at the logic high level till a point t2 and then falls to a logic low level. Since a signal LIO_RST_RD falls to the logic low level at a point at which a fourth signal LIO_RST (in a case of BL=4) is ended, a precharge control circuit operates with a precharge timing margin which is identical to a precharging signal during a burst write operation. Thereafter, the read is performed in the same manner as mentioned above.

Figure 9:
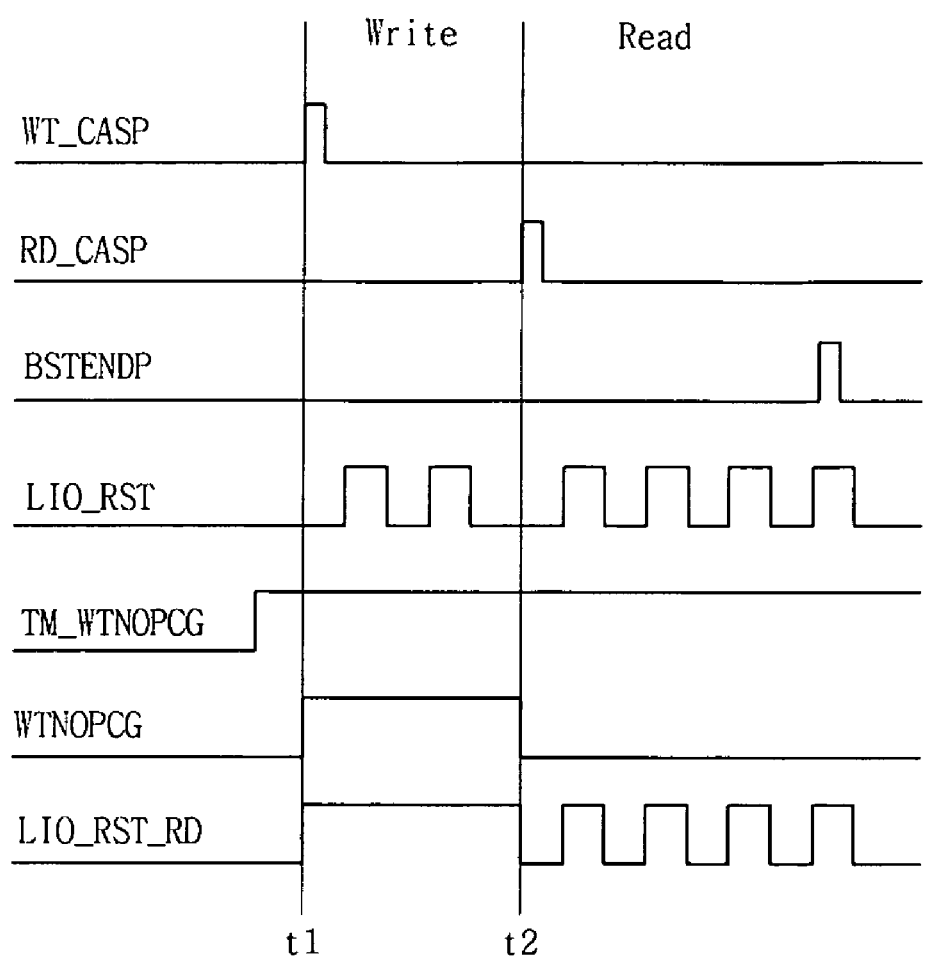
FIG. 9 illustrates a timing diagram for a write interrupt operation by a read command.

FIG. 9 illustrates a timing diagram for a write interrupt operation by a read command (BL=4).

Referring to FIG. 9, the operation up to the point t1 is the same as that in FIG. 8. A read command is input at a point t2. Hence, a control signal generating unit 10 generates a control signal WTNOPCG having a logic low level in response to a read command signal RD_CASP. In this instance, a timing margin of several hundred ps to ns is additionally obtained compared to a conventional technique. This is done because the signal RD_CASP is first output among the read commands, and the control signal generating unit 10 generates the control signal so that a delay of the control signal is minimized.

As described above, the precharging operation is not performed until the last burst operation during the write operation, thereby reducing power consumption. In addition, the precharging operation can be normally performed at a high voltage and a high-frequency clock by obtaining a sufficient precharge timing margin even if the interrupt operation occurs by the read command during this period changed from the write operation to the read operation or during the write operation.

While the present invention has been described with respect to examples and exemplary embodiments, it will be apparent to those skilled in the art that various changes and modifications may be made without departing from the spirit and scope of the present disclosure and the following claims.

The present application claims priority to Korean patent application number 10-2007-65851, filed on Jun. 29, 2007, the entire contents of which are incorporated herein by reference.

What is claimed is:

1. A precharge control circuit comprising:
   a precharge control unit controlling and outputting a precharge signal in response to a read command signal, a write command signal, and a first signal; and
   a precharge unit precharging local input/output lines in response to a signal output from the precharge control unit,
   wherein the first signal is activated during a last burst operation.

2. The precharge control circuit of claim 1, wherein the precharge control unit comprises:
   a control signal generating unit generating a control signal in response to the read command signal, the write command signal, and the first signal; and
   a first operation unit performing a first logic operation on the control signal and the precharge signal.

3. The precharge control circuit of claim 2, wherein the control signal generating unit comprises:
   a first driving unit driven in response to the write command signal and the first signal; and
   a second driving unit driven in response to the read command signal.

4. The precharge control circuit of claim 3, wherein the first driving unit comprises:
   a second operation unit performing a second logic operation on the write command signal and a test mode signal;
   a pull-up driving unit pull-up driven in response to an output signal of the second operation unit; and
   a pull-down driving unit pull-down driven in response to the first signal.

5. The precharge control circuit of claim 3, wherein the second driving unit comprises a pull-down driving unit pull-down driven in response to the read command signal.

6. The precharge control circuit of claim 3, wherein the control signal generating unit further comprises a reset unit pull-down driven in response to a reset signal.

7. The precharge control circuit of claim 3, wherein the control signal generating unit further comprises a latch unit latching output signals of the first and second driving units.

8. The precharge control circuit of claim 3, wherein the control signal generating unit further comprises a buffer unit buffering output signals of the first and second driving units.

9. The precharge control circuit of claim 3, wherein the first operation unit comprises a logic device performing an OR operation on the control signal and the precharge signal.

10. A precharge control circuit comprising:
   a control signal generating unit generating a control signal in response to a read command signal, a write command signal, and a first signal;
   a first operation unit performing a first logic operation on the control signal and a precharge signal; and
   a precharge unit precharging local input/output lines in response to an output signal of the operation unit,
   wherein the first signal is activated during a last burst operation.

11. The precharge control circuit of claim 10, wherein the control signal generating unit comprises:
   a first driving unit driven in response to the write command signal and the first signal; and
   a second driving unit driven in response to the read command signal.

12. The precharge control circuit of claim 11, wherein the first driving unit comprises:
   a second operation unit performing a second logic operation on the write command signal and a test mode signal;
   a pull-up driving unit pull-up driven in response to an output signal of the second operation unit; and
   a pull-down driving unit pull-down driven in response to the first signal.

13. The precharge control circuit of claim 11, wherein the second driving unit comprises a pull-down driving unit pull-down driven in response to the read command signal.

14. The precharge control circuit of claim 11, wherein the control signal generating unit further comprises a reset unit pull-down driven in response to a reset signal.

15. The precharge control circuit of claim 11, wherein the control signal generating unit further comprises a latch unit latching output signals of the first and second driving units.

16. The precharge control circuit of claim 11, wherein the control signal generating unit further comprises a buffer unit buffering output signals of the first and second driving units.

17. The precharge control circuit of claim 10, wherein the precharge control unit comprises a second operation unit performing a second logic operation on the control signal and the precharge signal.

18. The precharge control circuit of claim 17, wherein the operation unit comprises a logic device performing an OR operation on the control signal and the precharge signal.

* * * * *